United States Patent [19]

Ajika et al.

[11] Patent Number: 4,988,635
[45] Date of Patent: Jan. 29, 1991

[54] METHOD OF MANUFACTURING NON-VOLATILE SEMICONDUCTOR MEMORY DEVICE

[75] Inventors: Natsuo Ajika; Hideaki Arima, both of Hyogo, Japan

[73] Assignee: Mitsubishi Denki Kabushiki Kaisha, Tokyo, Japan

[21] Appl. No.: 356,144

[22] Filed: May 24, 1989

[30] Foreign Application Priority Data

Jun. 7, 1988 [JP] Japan .................. 63-141040

[51] Int. Cl.⁵ .......................... H01L 21/265
[52] U.S. Cl. .......................... 437/43; 437/49; 437/52; 437/195; 357/23.5
[58] Field of Search .......... 357/23.5; 437/43, 49, 437/195, 52, 27

[56] References Cited

U.S. PATENT DOCUMENTS 4,417,264  3/1983  Angle .
4,462,090  7/1984  Iizuka ..................... 357/23.5
4,513,397  12/1982  Ipri et al. .
4,775,642  10/1988  Chang et al. ............ 437/43

FOREIGN PATENT DOCUMENTS 5780779  11/1980  Japan .
89/11731  11/1989  PCT Int'l Appl. .......... 437/43

OTHER PUBLICATIONS

J. Yeargain & C. Kuo, "A High Density Floating-Gate Eeprom Cell", IEEE (1981), pp. 24-27.

Primary Examiner—Brian Hearn
Assistant Examiner—Chandra Chaudhari
Attorney, Agent, or Firm—Lowe, Price, LeBlanc, Becker & Shur

[57] ABSTRACT

A memory cell of 1 bit is constituted by 1 selecting transistor and 1 memory transistor in an EEPROM. One of the source-drain regions is commonly used by the selecting transistor and the memory transistor. The commonly used source-drain region is manufactured through the following steps. First, a gate electrode of the transistor is formed. An oxide film is deposited on the entire surface. A resist is applied thereon and is etched back to expose a surface of the oxide film on the gate electrode. Thereafter, the oxide films deposited on the side surfaces of the gate electrode are removed to form opening portions. Impurities are implanted to the silicon substrate utilizing the opening portions.

7 Claims, 9 Drawing Sheets

METHOD OF MANUFACTURING NON-VOLATILE SEMICONDUCTOR MEMORY DEVICE

BACKGROUND OF THE INVENTION

1. Field of the Invention

The present invention relates generally to manufacturing of semiconductor memory devices, and more particularly, to improvements to manufacturing of self-aligned non-volatile semiconductor memory devices.

2. Description of the Prior Art

Figure 4:
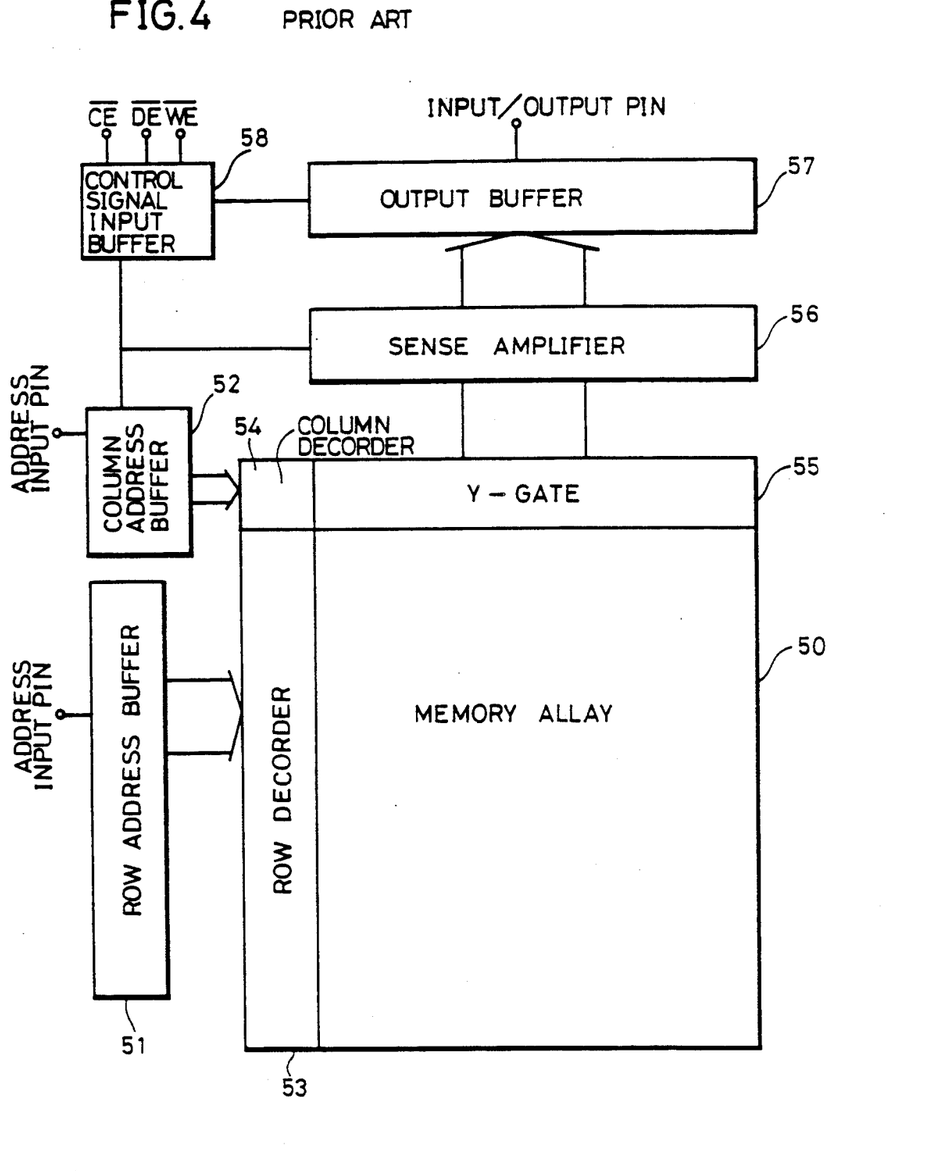
FIG. 4 is a block diagram showing a structure of a conventional common EEPROM.

FIG. 4 is a block diagram showing a generally known conventional non-volatile memory (hereinafter referred to as an EEPROM) in which information can be written and erased electrically.

Referring to FIG. 4, the EEPROM comprises a memory array 50 including the EEPROM cells; a row address buffer 51 externally receiving row address signals; a column address buffer 52 receiving column address signals; a row decoder 53 and a column decoder 54 decoding these address signals for applying voltage to a word line and a bit line connected to a specified memory cell; a sense amplifier 56 for reading a signal stored in the memory cell designated by two decoders through a Y gate 55; an output buffer 57 for outputting the read signal; and a control signal input buffer 58 receiving external control signals to apply the same to respective portions.

Figure 5:
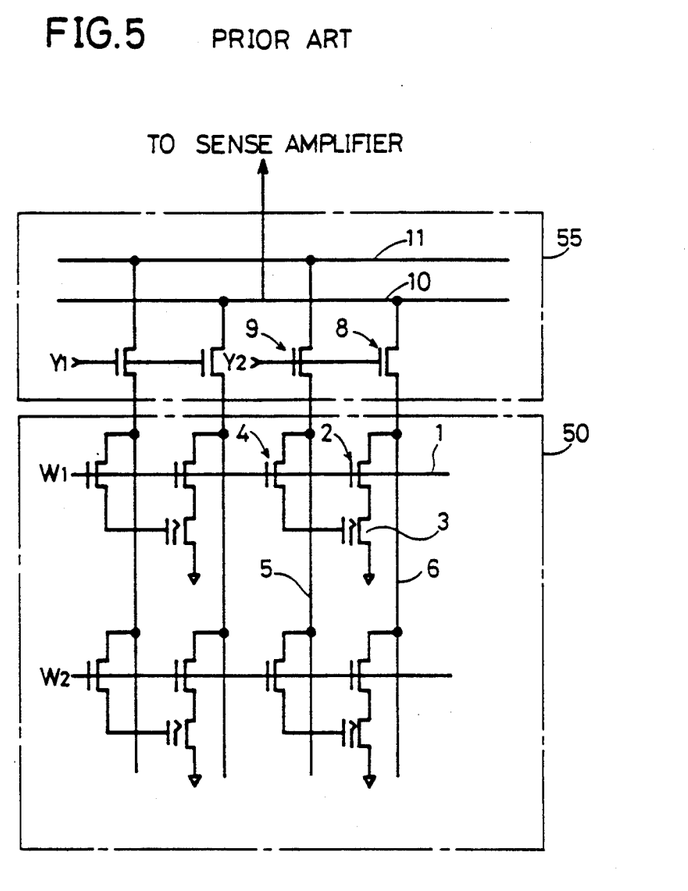
FIG. 5 is an equivalent circuit diagram of a memory array and a Y gate of the conventional EEPROM.

In operation, the sense amplifier 56 detects the signal stored in the memory cell, and amplifies the signal to apply the same to the output buffer 57. FIG. 5 is a schematic diagram showing an example of the memory array 50 and the Y gate 55 shown in FIG. 4.

Referring to FIG. 5, the Y gate 55 comprises a transistor 8 connected between an I/O line 10 and a bit line 6, and a transistor 9 connected between a CG line 11 and a control gate line 5. A Y gate signal Y2 is applied to the gates of the transistors 8 and 9. Transistors to which a Y gate signal Y1 is applied are connected in the similar manner.

In the memory array 50, four bits of memory cells are shown. For example, one memory cell comprises a memory transistor 3 having a floating gate, and a selecting transistor 2 having its gate connected to a word line 1 for applying a signal stored in the memory transistor 3 to a bit line 6. Another selecting transistor 4 has its gate connected to the word line 1 to apply a signal on a control gate line 5 to the gate of the memory transistor 3.

In operation, the memory transistor 3 stores a binary signal dependent on whether electrons are stored or not in the floating gate thereof. When electrons are stored, the threshold voltage of the transistor 3 becomes high. Therefore, the transistor 3 turns off in reading operation. A signal "1" is assigned to this state. When electrons are not stored, the threshold voltage of the transistor 3 becomes negative. Therefore, the transistor 3 turns on in reading operation. A signal "0" is assigned to this state.

A voltage for reading is applied from the sense amplifier to the bit line 6 through the transistor 8, and this voltage is further applied to the transistor 3 through the transistor 2. Consequently, it can be detected in the sense amplifier whether a current flows to the memory transistor 3 or not, thereby enabling reading of the signal stored in the memory transistor 3.

Figure 6A:
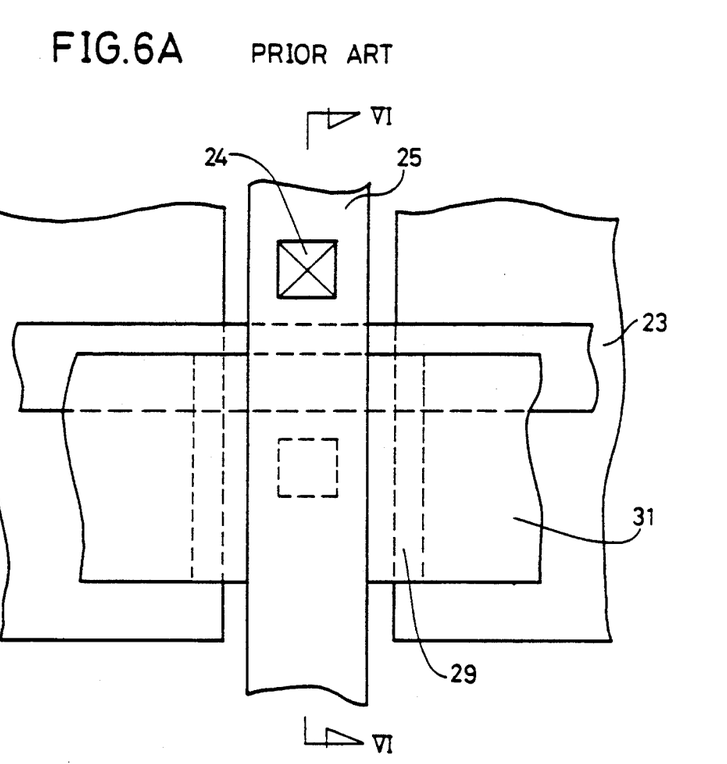
FIG. 6A is a plan view of a conventional EEPROM memory cell.
Figure 6B:
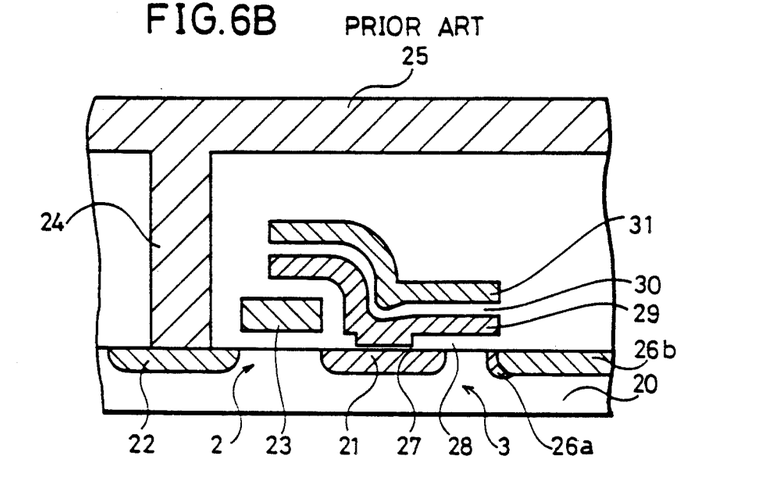
FIG. 6B is cross sectional view taken along the line VI—VI of FIG. 6B.

FIG. 6A is a plan view showing a structure of a memory cell constituting the memory array 50, and FIG. 6B is a cross sectional view taken along the line VI—VI of FIG. 6A. The structure of the memory cell will be described with reference to these figures. The memory cell of the EEPROM having such structure is disclosed in, for example, Japanese Patent Laying-Open Gazette No. 80779/1982.

The memory cell comprises the selecting transistor 2 and the memory transistor 3 formed on a main surface of a silicon semiconductor substrate 20. The selecting transistor 2 is constituted by a source region 21 and a drain region 22 formed by diffusing impurities to the main surface of the semiconductor substrate 20, and a selective gate 23 constituting a word line 1 for receiving a selecting signal. The drain region 22 is connected to an aluminum wiring 25 through a contact hole 24.

The memory transistor 3 comprises a drain region 21 (also serves as the source region for the selective transistor 2) and source regions 26a and 26b formed by diffusing impurities on the main surface of the semiconductor substrate 20, a thin tunneling oxide film 27 formed on a prescribed region of a surface of the drain region 21, a floating gate 29 formed on a surface of the tunneling oxide film 27 or on the surface of the gate oxide film 28 of the memory transistor 3 with one end thereof extending to an upper surface of the selective gate 23, and a control gate 31 formed thereon with an insulating film 30 interposed therebetween. The floating gate 29 stores charges and carries out discharge/introduction of charges to and from the drain region 21 through the tunneling oxide film 27 corresponding to the voltage applied between the control gate 31 and the drain region 21. Introduction/discharge of electric charges is carried out utilizing so-called tunneling effect through the tunneling oxide film 27. The tunneling effect is a phenomenon in which electric charges pierce a thin tunneling oxide film 27, with the charges having lower energy than energy barrier of the oxide film.

Figure 3A:
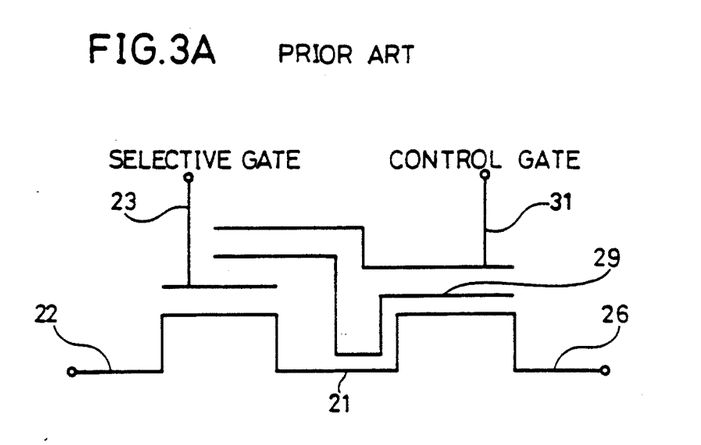
FIG. 3A is an equivalent circuit diagram of 1 memory cell of the EEPROM of the present invention.
Figure 3B:
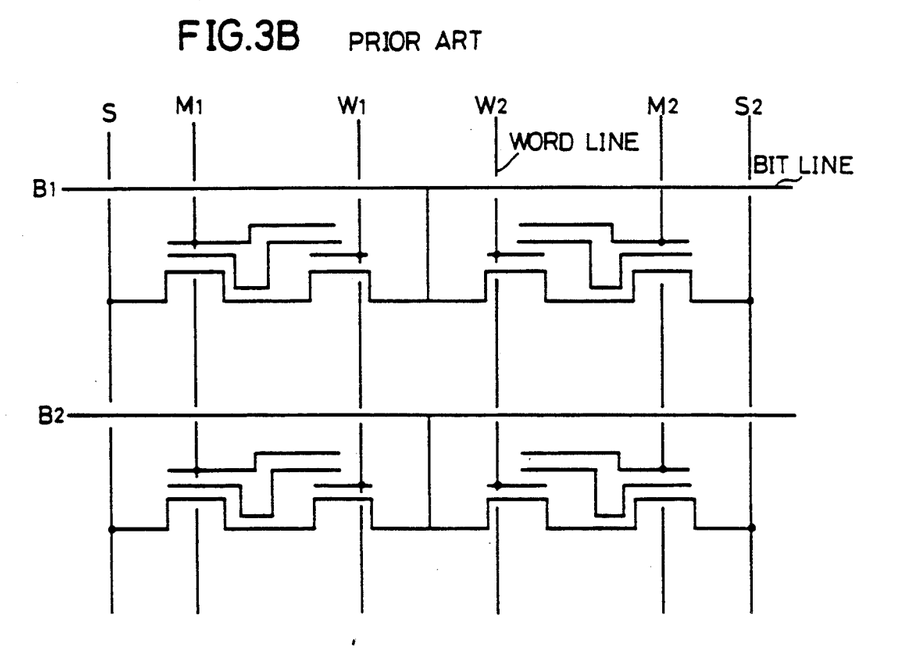
FIG. 3B is an equivalent circuit diagram of 4 bits of memory cells arranged in an array.

FIG. 3A is an equivalent diagram of 1 memory cell of the EEPROM, and FIG. 3B is an equivalent circuit diagram in which 4 memory cells (4 bits) are arranged in an array. The operation of the EEPROM will be described with reference to FIGS. 3A, 3B, 6A, 6B and 6C.

When electrons are to be introduced to the floating gate 29, a high voltage is applied to the selective gate 23, so that the selecting transistor 2 turns on. The bit line 25 (aluminum wiring) is set at 0V. A programming voltage is applied to the control gate 31. The source region 26 of the memory transistor 3 is set at 0V.

When electrons are to be drawn out from the floating 29, the selective gate 23 is set at a high voltage. Consequently, the selecting transistor 2 turns on. The bit line 25 is set at the programming voltage. The control gate 31 is set at 0V. The source region 26 of the memory transistor 3 is brought to the floating state. By the setting of the above described potentials, a high electric field is applied to the region where the floating gate 29 and the drain region 21 of the memory transistor 3 are overlapped with each other through the thin insulating film 42, whereby a tunneling current flows.

In data reading, the selecting transistor 2 is turned on. An appropriate potential is applied to the bit line 25. An appropriate potential is applied to the control gate 31. The source regions 26a and 26b of the memory transistor 3 is set at 0V. Whether the memory transistor 3 turns on or remains off is determined in this state, the binary state of the floating gate 29 is checked in accordance with the determination.

The process for manufacturing the conventional EEPROM memory cell will be described with reference to FIGS. 7A to 7G.

Figure 7A:
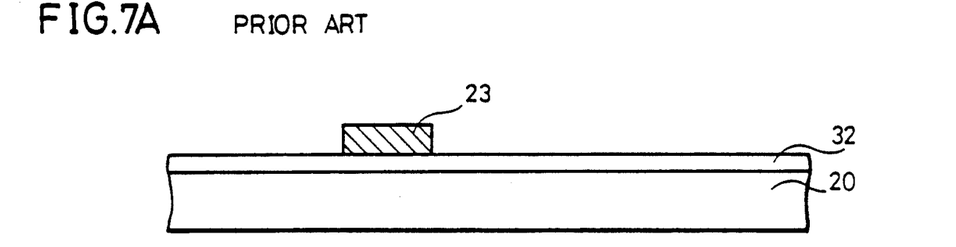
FIGS. 7A to 7G are cross sectional views showing the cross sectional structure of the conventional EEPROM in the order of the manufacturing steps.

First, as shown in FIG. 7A, a first oxide film 32 is formed on the semiconductor substrate 20, a polysilicon layer is deposited and patterned to form the selective gate 23 of the selecting transistor 2.

Figure 7B:
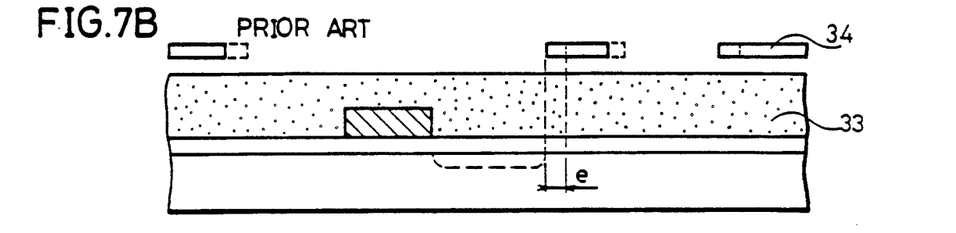

Thereafter, as shown in FIG. 7B, a resist 33 is applied on the surface of the semiconductor substrate, and the resist 33 is exposed using a first mask 34 which is formed to have a prescribed pattern by the photolithography method.

Figure 7C:
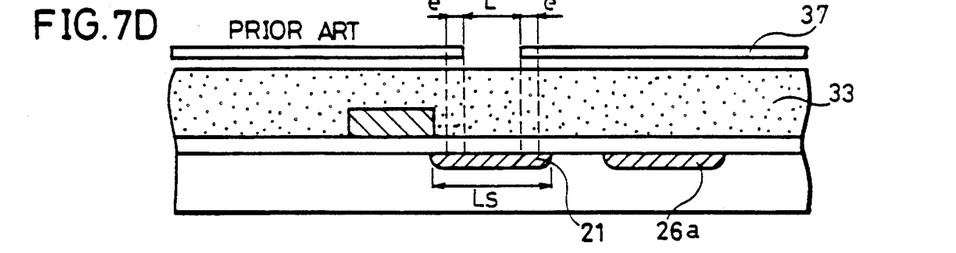

As shown in FIG. 7C, the resist 33 is patterned. Ion implantation of impurities 35 is carried out on the surface of the semiconductor substrate with the resist 33 serving as a mask. Ion implantation is carried out with relatively small dosage of about $1 \times 10^{14}/cm^2$. Consequently, the source region 21 (also serves as the drain region of the memory transistor 3) of the selecting transistor 2 and the source region 26a of the memory transistor 3 are formed on the surface of the semiconductor substrate. The source region 21 is formed to have a low concentration in order to ensure high quality of the tunneling oxide film formed thereon.

As shown in FIG. 7D, the resist 33 is again applied on the surface of the semiconductor substrate, and the resist 33 is exposed using a second mask 37 having an opening pattern for forming the tunneling oxide film.

Figure 7D:
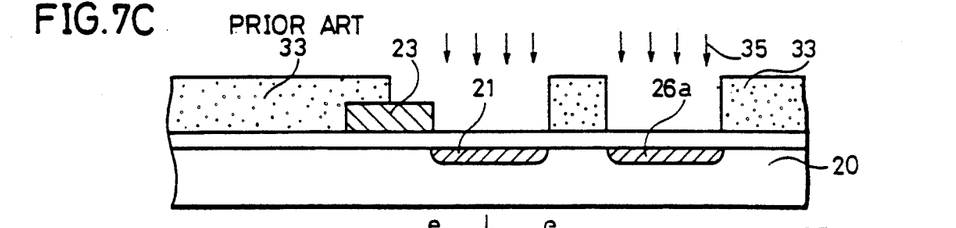
Figure 7E:
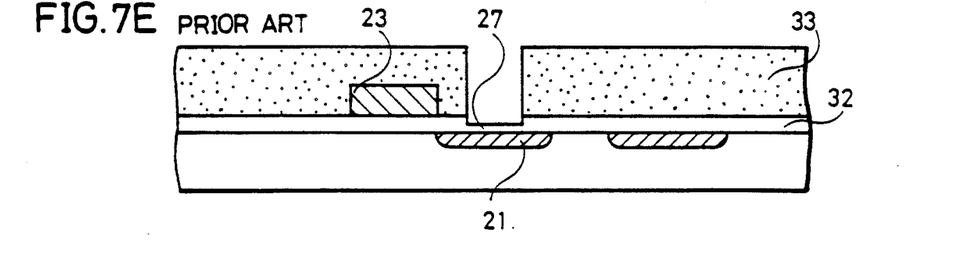

Thereafter, as shown in. FIG. 7E, the resist 33 is developed and patterned, the first oxide film 32 deposited on the surface of the source region 21 is etched to form a thin tunneling oxide film 27.

Figure 7F:
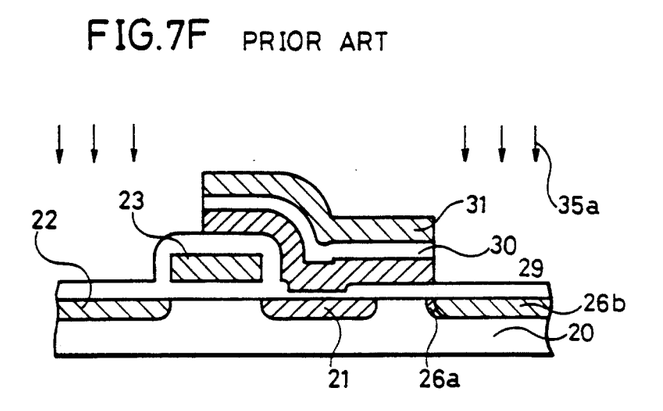

Then, as shown in FIG. 7F, a first polysilicon layer, a second oxide film and a second polysilicon layer are deposited on the semiconductor substrate 20, and they are patterned to form the floating gate 29 the insulating film 30 and the control gate 31. Thereafter, impurity ions 35a with the dosage of $5 \times 10^{15}/cm^2$ are implanted in the surface of the semiconductor substrate 20, using the control gate 31 as a mask. By the step of this ion implantation, a drain region 22 and source regions 26a and 26b having higher concentration than the source region 21 are formed.

Figure 7G:
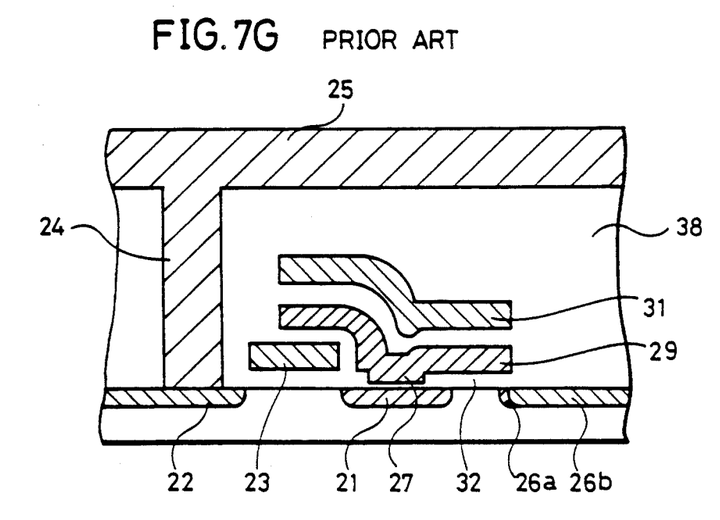

As shown in FIG. 7G, an interlayer insulating film 38 is deposited on the surface where the control gate 31 is formed, and the surface of the film is made flat. A prescribed region of the interlayer insulating film 38 is opened to provide the contact hole 24, and thereafter, the aluminum wiring layer 25 is formed. The manufacturing process of the device is thus completed.

As described above, the conventional method for manufacturing EEPROMs requires two steps of photolithography. The first step is the step of forming the resist pattern for forming the source and drain regions 21, 26a and 26b of the selecting transistor 2 and of the memory transistor 3 on the semiconductor substrate 20 (FIGS. 7B and 7C). The second step is the step of forming the resist pattern for forming the tunneling oxide film 27 in the source region 21 of the selecting transistor 2 (FIGS. 7D and 7E). The photolithography step comprises a step of aligning masks in which masks for exposing the resist to a prescribed pattern are set at prescribed positions in association with the semiconductor substrate. In the step of mask alignment, there will be errors in alignment of about 0.1 μm, when we consider the precision of the alignment. Therefore, the diffusion width of the diffusion region of the source region 21 of the selecting transistor 2 formed through two steps of photolithography should include the margin for the error in mask alignment. This relation will be described with reference to the figures. First, referring to FIG. 7D, the width $L_S$ of diffusion of the source region 21 should be made wider than the width of the opening width L for forming the tunneling oxide film plus the error e in mask alignment. In addition, the width $L_S$ of diffusion of the source region 21 should be wide enough to include the error e in aligning the mask 34 for forming the source and drain regions, as shown in FIG. 7B. Therefore, the width $L_S$ of diffusion of the source region 21 is formed to have the width required for the function plus the errors in mask alignment, so that unnecessary portions in the diffusion region become large. Therefore, it is a factor preventing minimization of the memory cell structure and improvement of the degree of integration.

SUMMARY OF THE INVENTION

Therefore, an object of the present invention is to provide a method for manufacturing a semiconductor memory device in which the impurity diffusion region of a transistor constituting the memory cell can be minimized to enhance the degree of integration.

The present invention is a method for manufacturing a semiconductor memory device including a memory element having two impurity diffused regions and first and second conductive layers for storing memory information, and a selecting element having two impurity diffused regions and a third conductive layer for selectively taking out the information in the memory element, comprising the steps of (a) forming a first oxide film on a surface of a semiconductor substrate;

(b) forming a third conductive layer on the first oxide film;

(c) forming a film to be etched on a surface of the third conductive layer and on the surface of the semiconductor substrate;

(d) applying a resist on a surface of the film to be etched and making flat the surface of the resist;

(e) etching the resist to expose the surface of the film to be etched deposited on the surface of the third conductive layer;

(f) etching the film to be etched and the first oxide film using the resist as a mask to form an opening portion deep enough to reach the surface of the semiconductor substrate in a region being in contact with a side surface of the third conductive layer;

(g) implanting ions of impurities to the surface of the semiconductor substrate using the third conductive layer and the resist as masks;

(h) removing the first oxide film, the film to be etched and the resist deposited on regions of the semiconductor substrate except the region where the third conductive layer is formed;

(i) forming a second oxide film on the surface of the third conductive layer and on the surface of the semiconductor substrate;

(j) depositing a first conductive layer, an interlayer insulating film and second conductive layer on the surface of the second oxide film to pattern the same; and (k) implanting ions of impurities to the semiconductor substrate using the second and third conductive layers as masks.

In the present invention, the impurity diffused region of the selecting element of the memory cell is formed through the steps of: forming an oxide film (a film to be etched) on a side wall of the third conductive layer; covering the periphery of the oxide film with a resist; removing only the oxide film on the side wall by etching with the resist serving as a mask to form an opening portion in the resist in which the oxide film region is inverted to provide an inverted pattern; and implanting ions of impurities in the semiconductor substrate utilizing the opening portion. In this method, the impurity diffused region is formed in self alignment to the third conductive layer. In addition, the diffused region is defined by the width of the opening portion which is provided by the inversion of the oxide film region, and therefore, the width of the diffused region can be minimized corresponding to the film thickness of the oxide film.

The impurity diffused region arranged on the side opposite to the memory element of the impurity diffused regions of the selecting element is formed through two steps of ion implantation. By changing the type and density of the impurities in respective ion implantation steps, the impurity diffused region having double diffusion structure can be provided. This reduces voltage stress in the substrate of the device and increases source to drain breakdown voltage.

Accordingly, a further object of the invention is to provide a method of manufacturing a double diffused region within the substrate of a non-volatile semiconductor memory device, to reduce the tendency of device breakdown to occur.

The first conductive layer of the memory element is formed on the semiconductor substrate where the impurity diffused regions are formed and on the surface of the third conductive layer with a thin oxide film interposed therebetween. An end surface arranged on the side of the third conductive layer of the valid portions of the first conductive layer which generates tunneling phenomenon with the impurity diffused regions is formed spaced apart from the side wall of the third conductive layer by a distance corresponding to the film thickness of the thin oxide film. Therefore, the overlapping between the impurity diffused region and the first conductive layer can be adjusted by adjusting the film thickness of the thin oxide film.

As described above, the degree of integration of the semiconductor memory device can be improved by reducing the width of diffusion of the impurity diffused regions and by reducing the area of the semiconductor element.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

One embodiment of the present invention will be described in detail with reference to the figures.

FIGS. 2A to 2I are cross sectional views showing the cross sectional structure of the memory cell of the EEPROM in accordance with one embodiment of the present invention in the order of the manufacturing steps. The method for manufacturing the memory cell will be described with reference to these figures.

Figure 2A:
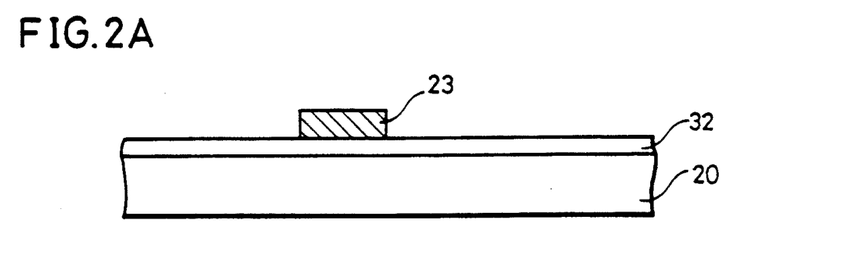
FIGS. 2A to 2I are cross sectional views showing step by step the method for manufacturing the EEPROM of the present invention.

First, as shown in FIG. 2A, an element isolating oxide film and a channel stopper region (not shown) are formed on a prescribed region of a main surface of the semiconductor substrate 20. A first oxide film 32 is formed on the main surface of the semiconductor substrate 20. A polysilicon layer with n type impurities doped is deposited on the surface, and photolithography and etching steps are carried out to form a selective gate 23 (third conductive layer) of the selecting transistor (selecting element).

Figure 2B:
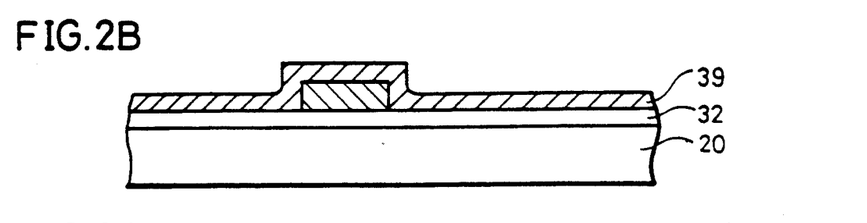

Thereafter, as shown in FIG. 2B, a second oxide film 39 (a film to be etched) of the film thickness of about 2000 A is formed by the CVD (Chemical Vapor Deposition) method on the surface of the first oxide film 32 on which the selective gate 23 is formed.

Figure 2C:
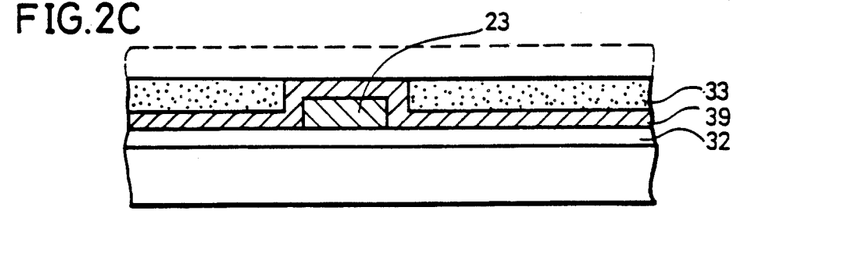

Then, as shown in FIG. 2C, a resist 33 is applied on the surface of the second oxide film 39 with the surface of the resist made flat. The surface of the resist 33 is etched back, and the etching is completed with the surface of the second oxide film 39 deposited on the surface of the selective gate 23 being exposed.

Figure 2D:
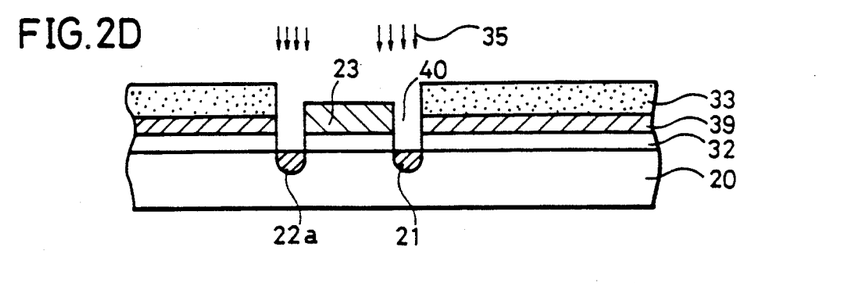

Thereafter, as shown in FIG. 2D, the second oxide film 39 is removed by etching, for example, reactive ion etching, using the resist 33 as a mask. By this etching, an opening portion 40 deep enough to reach the surface of the semiconductor substrate 20 is formed on the side surface of the selective gate 23. Ion implantation of impurities 35 is selectively carried out on the surface of the semiconductor substrate 20 utilizing the opening portion 40. Ions of phosphorus or arsenic, or of phosphorus and arsenic are doped to the density of about 4 $\sim 5 \times 10^{14}$ cm$^{-2}$. Consequently, the source region 21 and the drain region 22a of the selecting transistor are formed on the surface region of the semiconductor substrate 20.

Figure 2E:
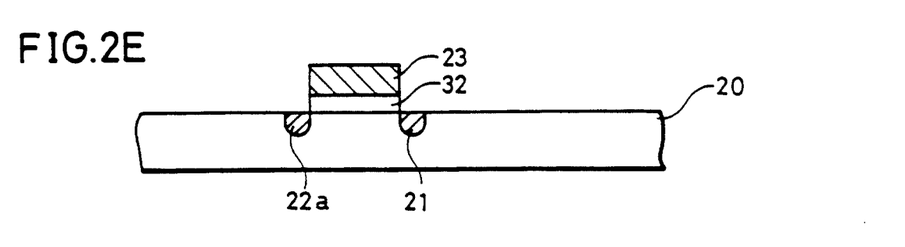

As shown in FIG. 2E, the resist 33, the second oxide film 39 and the first oxide film 32 are removed by etching.

Figure 2F:
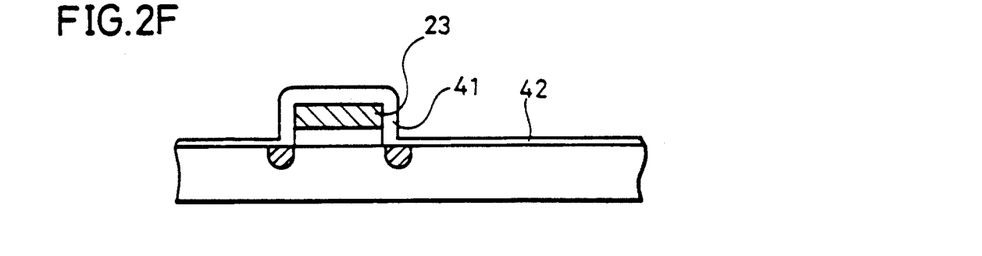

Thereafter, as shown in FIG. 2F, an insulating film 41 having the thickness of more than 500 A is formed on the exposed surface of the selective gate 23 and a thin insulating film 42 having the thickness of less than 200 A is formed on the surface of the semiconductor substrate 20, by thermal oxidation. The thin insulating film 42 constitutes a tunneling oxide film.

Figure 2G:
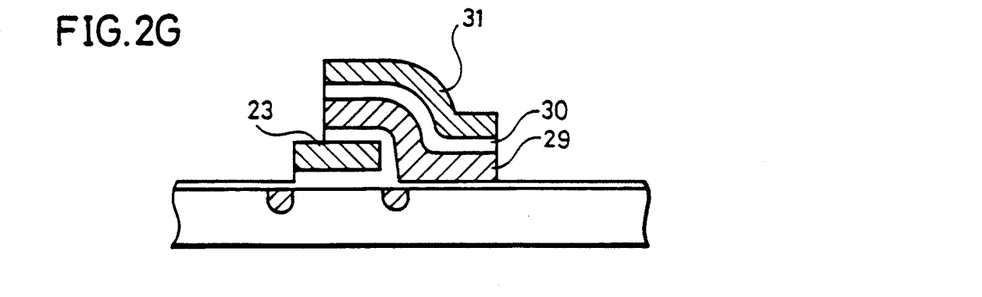

Then, as shown in FIG. 2G, a first polysilicon layer is deposited by the CVD method on the surface of the insulating film 41 or on the thin insulating film 42, the surface thereof is thermally oxidized to form an interlayer insulating film of the silicon oxide film, and polysilicon layer is further deposited on the surface by the CVD method. The first and second polysilicon layers and the interlayer insulating film are patterned to a prescribed shape by photolithography and etching, thereby providing the floating gate 29 (first conductive layer), interlayer insulating film 30 and the control gate 31 (second conductive layer), respectively.

Figure 2H:
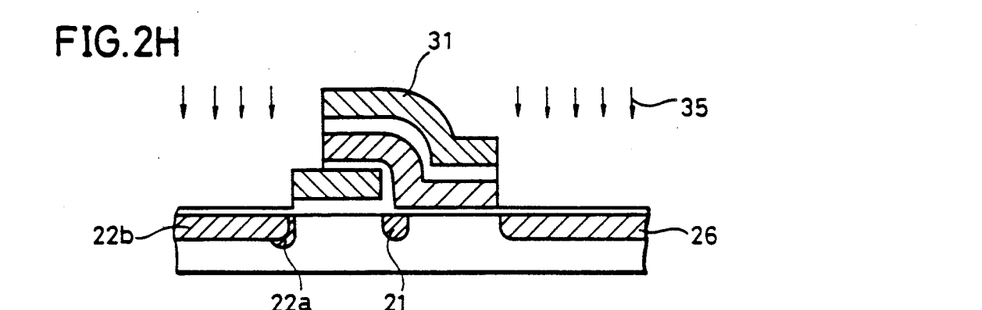

Thereafter, as shown in FIG. 2H, ion implantation of impurities 35 is carried out on the surface of the semiconductor substrate 20 using the control gate 31 and the like as masks to form the drain region 22b of the selecting transistor 22 and the source region 26 of the memory transistor 3 (memory element). In the ion implantation, phosphorus ions are doped to the density of about $4 \sim 5 \times 10^{15}$ cm$^{-2}$. Double diffusion structure comprising a high density impurity region 22b and a low density impurity region 22a is provided in the drain region of the selecting transistor through this method.

Figure 2I:
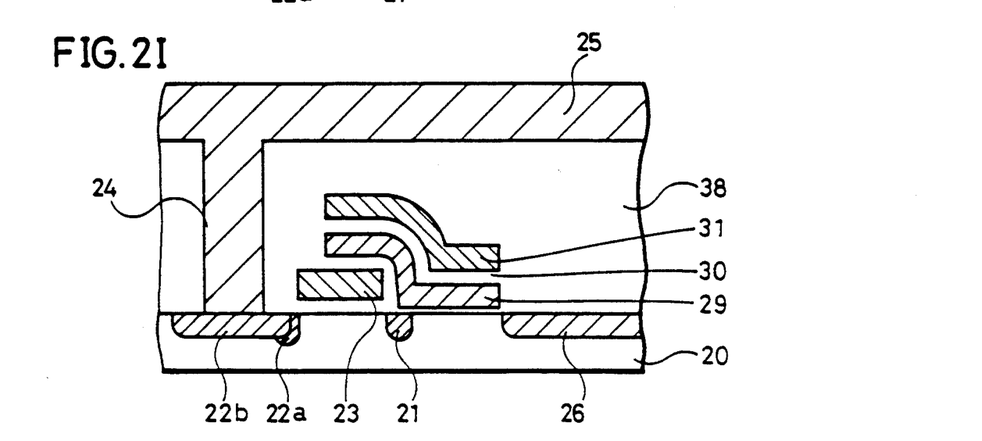

Finally, as shown in FIG. 2I, the surface of the semiconductor substrate 20 on which the selecting transistor 2 and the memory transistor 3 are formed is covered by an interlayer insulating film 38 to make the surface flat. A contact hole 24 is formed in a prescribed region of the interlayer insulating film, and an aluminum wiring layer 25 is connected to the drain region 22b of the selecting transistor 2 through the contact hole 24, and thus, the manufacturing process of the memory cell of the EEPROM is completed.

Figure 1A:
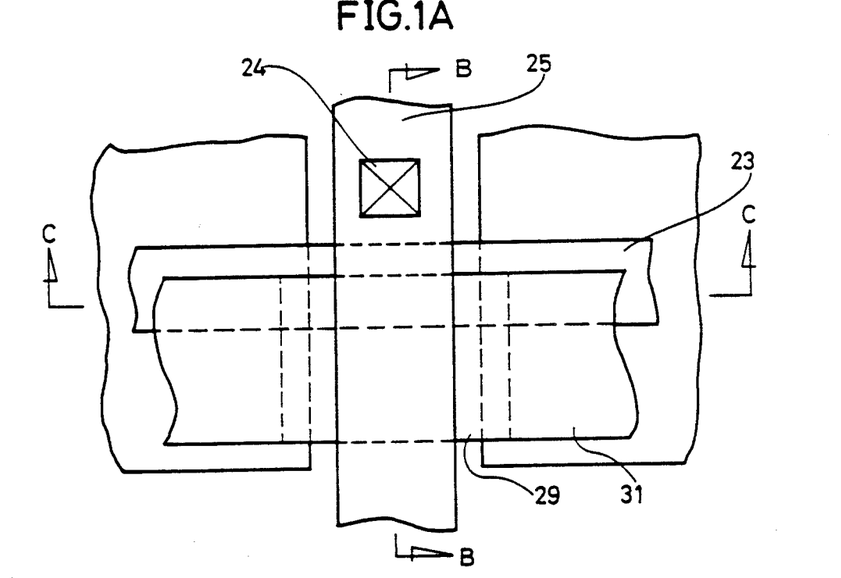
FIG. 1A is a plan view of an EEPROM in accordance with one embodiment of the present invention.

The memory cell of the semiconductor memory device manufactured by the above described method is shown in the plan view of FIG. 1A. The cross sectional structure viewed from the line B—B and that from the line C—C of FIG. 1A are respectively shown in FIGS. 1B and 1C. As is apparent from these figures, in the memory cell, the selective gate 23 of the selecting transistor 2 and the source region 21 are formed in self alignment with the end portions registered with each other. In addition, the width of diffusion of the source region 21 is practically defined by the film thickness of the second oxide film 39 formed on the side wall of the selective gate 23. Therefore, the width of diffusion of the source region 21 can be minimized to about 1000 ~2000 Å, which could not be realized in the conventional photolithography method in consideration of the margin for the error in mask alignment. In addition, the floating gate 29 with a portion overlapped with the source region 21 is formed on the source region 21 with the thin tunneling oxide film 42 interposed therebetween, by forming the insulating film 41 on the side wall of the selective gate 23. Consequently, the tunneling effect can be generated at the overlapping portion of the floating gate 29 and the source region 21.

Figure 1B:
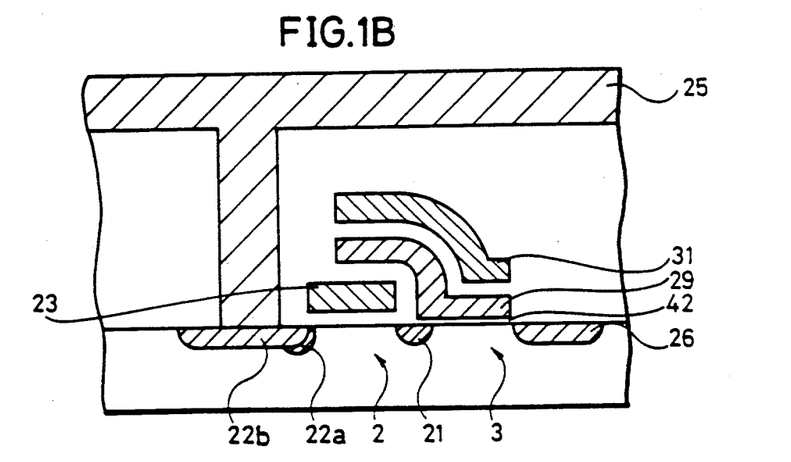
FIGS. 1B and 1C are cross sectional views taken along the lines B—B and C—C of FIG. 1A, respectively.
Figure 1C:
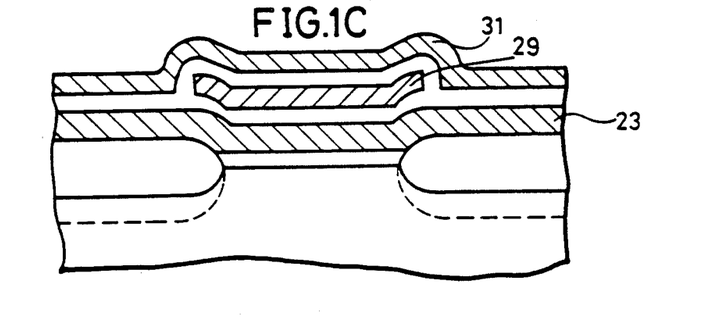

In addition, the drain regions 22a and 22b of the selecting transistor have the double diffusion structure. Therefore, the concentration of electric field near the drain region can be released, thereby improving the source-drain breakdown voltage.

As described above, in the present invention, the width of diffusion of the impurity diffused region (source region of the selecting transistor 2 or the drain region of the memory transistor 3) of the semiconductor memory device is reduced to improve the degree of integration of the device. In the above described embodiment, the areas occupied by the device is reduced by about 20% compared with a conventional semiconductor memory device manufactured by the photolithography method.

Although the present invention was applied to an EEPROM in the above embodiment, the present invention may be applied to such devices in which a plurality of gates are formed each operating in association with an impurity diffused region in the semiconductor substrate.

Although the present invention has been described and illustrated in detail, it is clearly understood that the same is by way of illustration and example only and is not to be taken by way of limitation, the spirit and scope of the present invention being limited only by the terms of the appended claims.

WHAT IS CLAIMED IS:

1. A method for manufacturing a semiconductor memory device having a memory element with two impurity diffused regions and first and second conductive layers for storing memory information and a selecting element with two impurity diffused regions and a third conductive layer for selectively taking out information of said memory element, comprising the steps of:

forming a first oxide film on a surface of a semiconductor substrate;

forming said third conductive layer on a surface of said first oxide film;

forming a film to be etched on a surface of said third conductive layer and the surface of said first oxide film;

applying a resist on a surface of said film to be etched;

etching said resist to expose the surface of said film to be etched deposited on the surface of said third conductive layer;

etching said film to be etched and said first oxide film using said resist as a mask to form an opening portion deep enough to reach the surface of said semiconductor substrate in a region which is in contact with a side surface of said third conductive layer;

implanting ions of impurities to the surface of said semiconductor substrate using said third conductive layer and said resist as a mask;

removing said first oxide film, said film to be etched and said resist deposited on regions of said semiconductor substrate except the region on which said third conductive layer is formed;

forming a second oxide film on the surface of said third conductive layer and on the surface of said semiconductor substrate;

depositing said first conductive layer, an interlayer insulating film and said second conductive layer on the surface of said second oxide film and patterning the same; and implanting ions of impurities to said semiconductor substrate using said second and third conductive layers as a mask to form a graded impurity region in the substrate.

2. A method for manufacturing a semiconductor memory device according to claim 1, wherein said opening portion is formed by anisotropically etching said film to be etched and said first oxide film.

3. A method for manufacturing a semiconductor memory device according to claim 1, wherein said second oxide film is formed by thermal oxidation.

4. A method for manufacturing a semiconductor memory device according to claim 1, wherein a material of said film to be etched is the same as that of said first oxide film.

5. A method for manufacturing a semiconductor memory device having a memory element with two impurity diffused regions and first and second conductive layers for storing memory information and a selecting element with two impurity diffused regions and a third conductive layer for selectively taking out information of said memory element, comprising the steps of:

forming a first oxide film on a surface of a semiconductor substrate;

forming said third conductive layer on a surface of said first oxide film;

forming a film to be etched on a surface of said third conductive layer and the surface of said first oxide film;

applying a resist on a surface of said film to be etched;

etching said resist to expose the surface of said film to be etched deposited on the surface of said third conductive layer;

etching said film to be etched and said first oxide film using said resist as a mask to form an opening portion deep enough to reach the surface of said semiconductor substrate in a region which is in contact with a side surface of said third conductive layer;

implanting ions of impurities having first impurity concentration to the surface of said semiconductor substrate using said third conductive layer and said resist as a mask;

removing said first oxide film, said film to be etched and said resist deposited on regions of said semiconductor substrate except the region on which said third conductive layer is formed;

forming a second oxide film on the surface of said third conductive layer and on the surface of said semiconductor substrate;

depositing said first conductive layer, an interlayer insulating film and said second conductive layer on the surface of said second oxide film and patterning the same; and implanting ions of impurities having a second impurity concentration greater than said first impurity concentration to said semiconductor substrate using said second and third conductive layers as a mask to form a graded impurity region in the substrate.

6. A method for manufacturing a non-volatile memory cell of a semiconductor memory device, comprising the steps of:

forming selectively a select gate on a major surface of a semiconductor substrate through a first gate insulator;

forming first and second impurity regions on said major surface of said semiconductor substrate by using said select gate as a part of a mask;

forming selectively a floating gate on said major surface of said semiconductor substrate which is positioned at one side of said second impurity region through a second gate insulator and on a part of said control gate through an insulator;

forming selectively a control gate on said floating gate through an insulator; and forming third and fourth impurity regions on said semiconductor substrate by using said select gate and said control gate as a part of a mask, said third impurity region overlapping said first impurity region.

7. A method according to claim 6, wherein said step of forming said first and second impurity regions comprises the steps of:

forming a film to be etched on a surface of said select gate and the surface of said first gate insulator;

applying a resist on a surface of said film to be etched;

etching said resist to expose the surface of said film to be etched deposited on the surface of said select gate;

etching said film to be etched and said first gate insulator using said resist as a mask to form an opening portion deep enough to reach the surface of said semiconductor substrate in a region which is in contact with a side surface of said select gate; and implanting ions of impurities to the surface of said semiconductor substrate using said select gate and said resist as a mask.

* * * * *